(12) United States Patent
Lanson et al.

(10) Patent No.: US 11,346,897 B2
(45) Date of Patent: May 31, 2022

(54) MAGNETIC FIELD SENSOR ON INTEGRATED CIRCUIT

(71) Applicant: LEM INTERNATIONAL SA, Plan-les-Ouates (CH)

(72) Inventors: Jean-François Lanson, Reignier-Esery (FR); Dominik Schläfli, Nyon (CH)

(73) Assignee: LEM International SA, Plan-les-Ouates (CH)

( * ) Notice: Subject to any disclaimer, the term of this patent is extended or adjusted under 35 U.S.C. 154(b) by 0 days.

(21) Appl. No.: 17/440,332

(22) PCT Filed: Mar. 13, 2020

(86) PCT No.: PCT/EP2020/056781
§ 371 (c)(1),
(2) Date: Sep. 17, 2021

(87) PCT Pub. No.: WO2020/187726
PCT Pub. Date: Sep. 24, 2020

(65) Prior Publication Data
US 2022/0091195 A1 Mar. 24, 2022

(30) Foreign Application Priority Data
Mar. 20, 2019 (EP) ..................... 19164071

(51) Int. Cl.
*G01R 33/07* (2006.01)
*G01R 33/00* (2006.01)
*G01R 33/09* (2006.01)

(52) U.S. Cl.
CPC ......... *G01R 33/07* (2013.01); *G01R 33/0094* (2013.01); *G01R 33/09* (2013.01)

(58) Field of Classification Search
CPC ..... G01R 33/07; G01R 33/0094; G01R 33/09
See application file for complete search history.

(56) References Cited

U.S. PATENT DOCUMENTS

| 4,703,483 A | * | 10/1987 | Enomoto | ............ | H01L 25/0657 |
| | | | | | 714/724 |
| 2003/0008424 A1 | * | 1/2003 | Kajiwara | ................ | H01L 25/16 |
| | | | | | 438/18 |

(Continued)

FOREIGN PATENT DOCUMENTS

WO 2015/113184 8/2015

OTHER PUBLICATIONS

International Search Report and Written Opinion issued by the European Patent Office, dated May 18, 2020, for International Patent Application No. PCT/EP2020/056781; 12 pages.

*Primary Examiner* — Alvaro E Fortich
(74) *Attorney, Agent, or Firm* — Faegre Drinker Biddle & Reath LLP

(57) ABSTRACT

A magnetic field sensor comprises a signal conditioning IC and a magnetic field sensor IC, the magnetic field sensor IC being mounted on and connected to the signal conditioning IC. The magnetic field sensor IC comprises a semi-conductor substrate with a sensor active layer disposed an outer facing side of the magnetic field sensor opposite the signal conditioning IC. The sensor active layer is connected to conductive vias that extend through the semi-conductor substrate from said outer facing side to an underside facing the signal conditioning IC, an underside of the conductive via being electrically interconnected to a connection pad on the signal conditioning IC via a chip-on-chip interconnection comprising a conductive bead connection and a solder connection.

13 Claims, 3 Drawing Sheets

(56) References Cited

U.S. PATENT DOCUMENTS

| | | | |
|---|---|---|---|
| 2003/0085461 A1* | 5/2003 | Sakiyama | H01L 25/18 257/700 |
| 2008/0081458 A1* | 4/2008 | Lin | H01L 24/11 438/620 |
| 2010/0246152 A1* | 9/2010 | Lin | H01L 23/481 361/783 |
| 2014/0005517 A1 | 1/2014 | Nagarkar | |
| 2017/0328962 A1 | 11/2017 | Schott | |

* cited by examiner

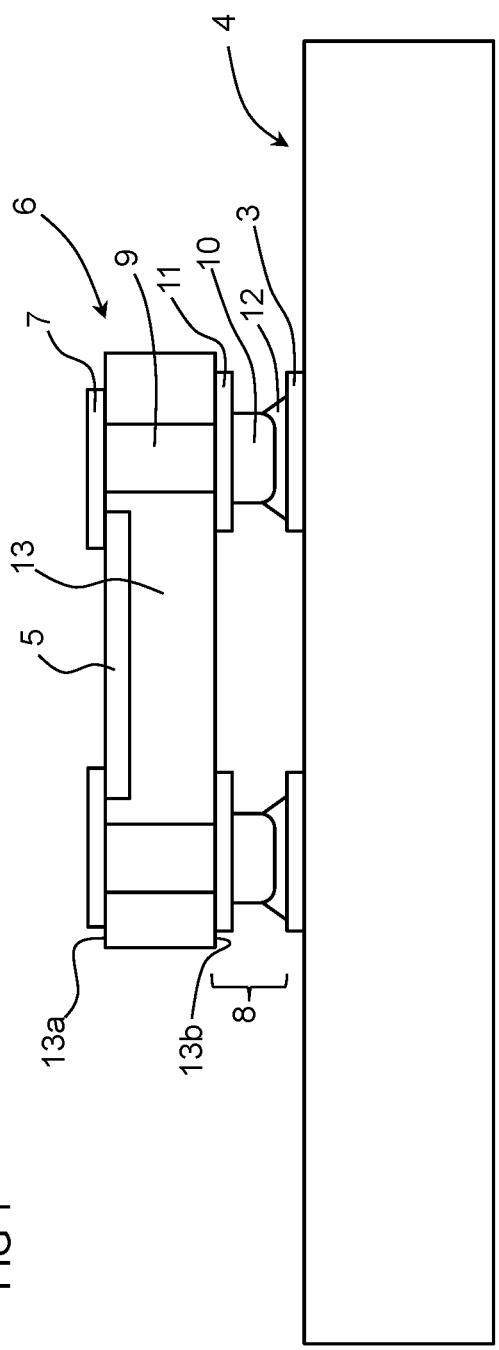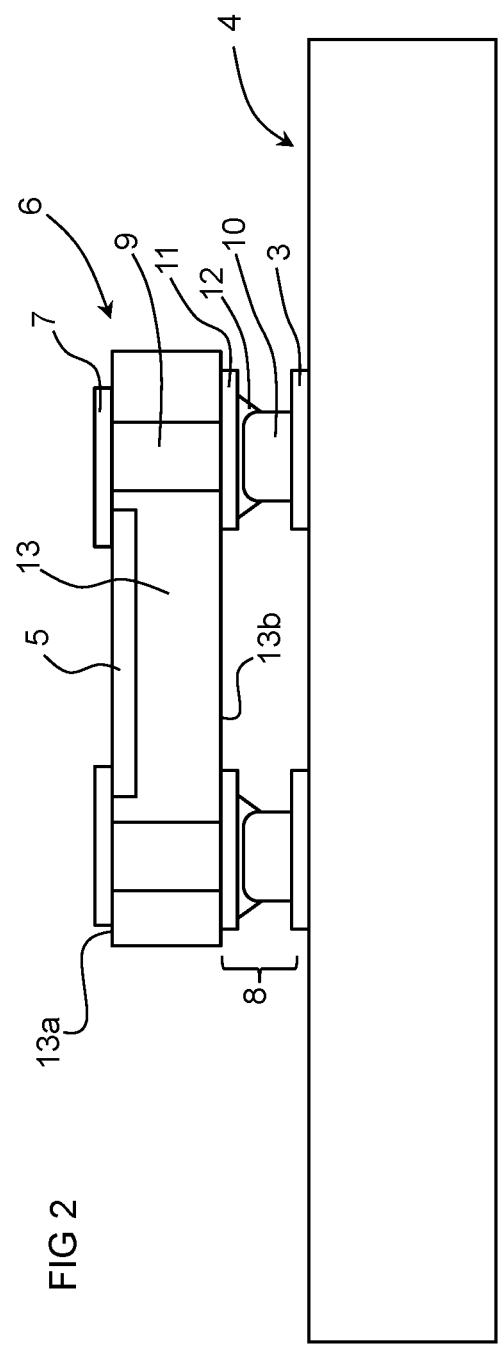

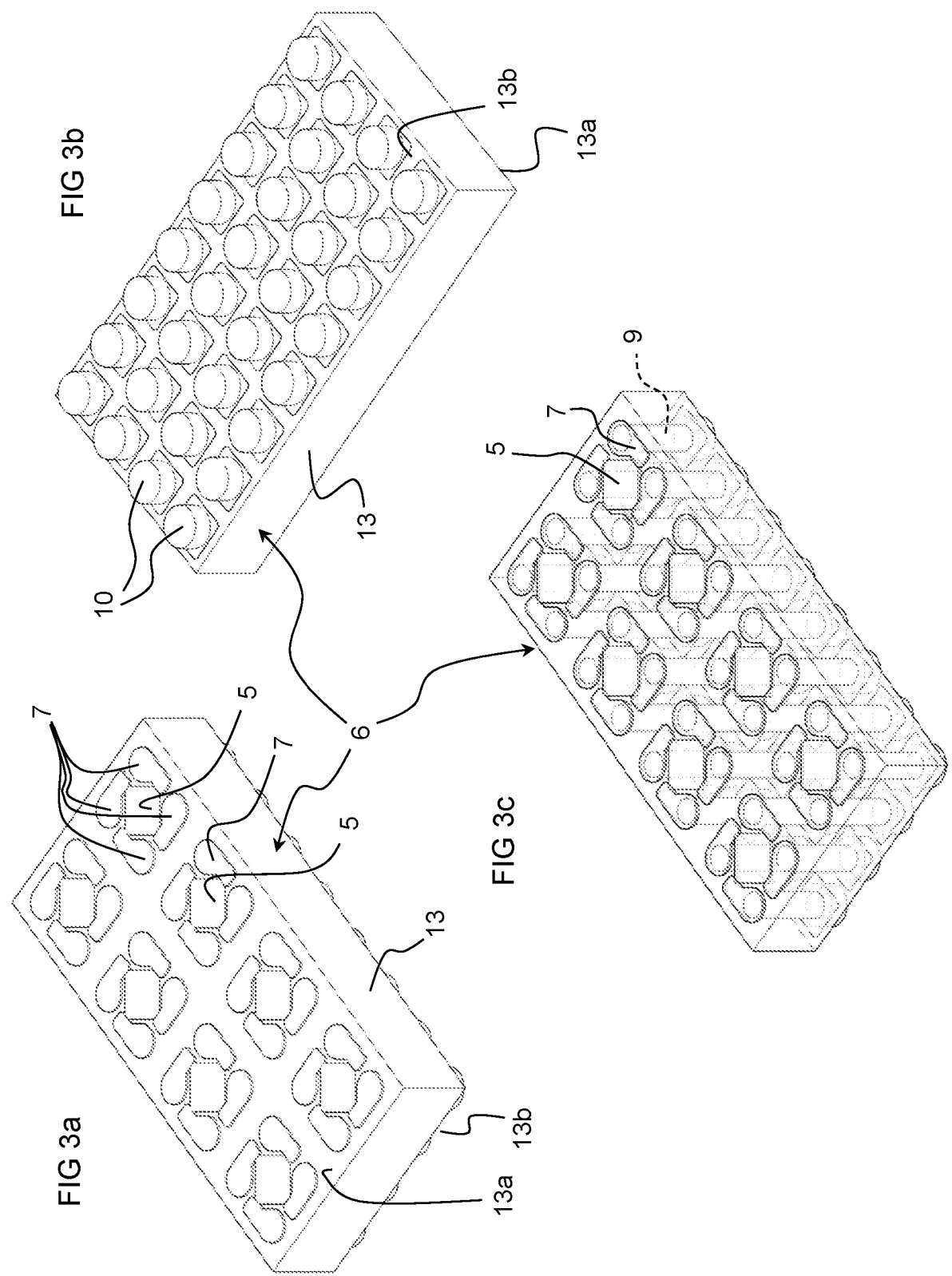

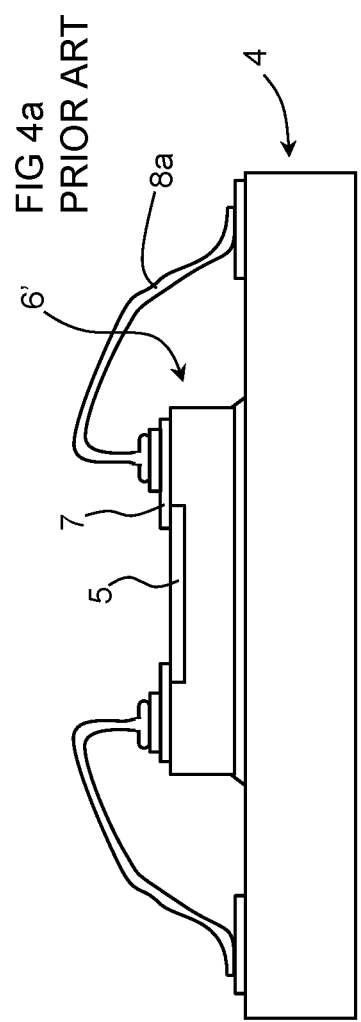
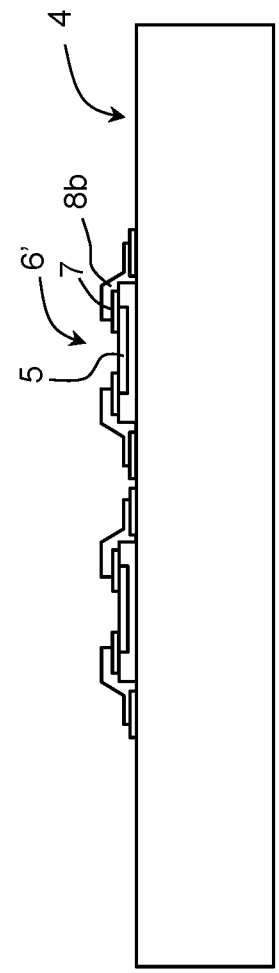
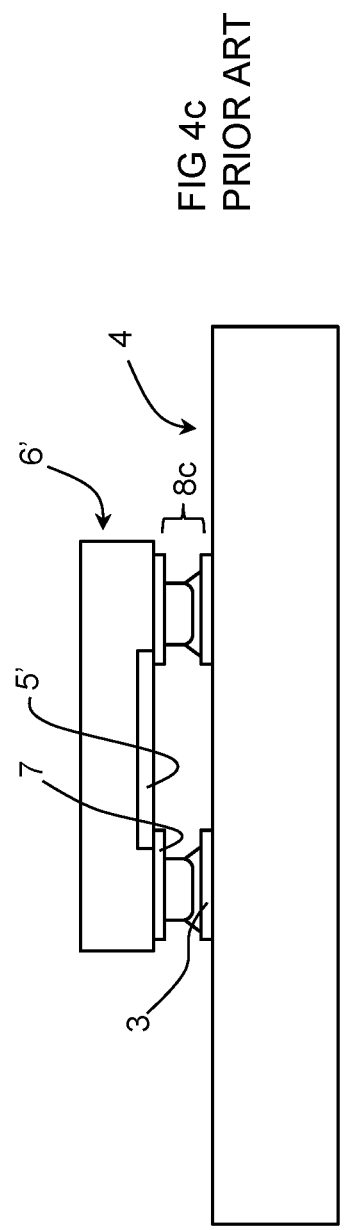

MAGNETIC FIELD SENSOR ON INTEGRATED CIRCUIT

CROSS-REFERENCE TO RELATED APPLICATIONS

The present application is a national stage entry of International (PCT) Patent Application Number PCT/EP2020/056781, filed Mar. 13, 2020, which in turn claims priority to European Patent Application No. 19164071.3, filed Mar. 20, 2019, the subject matter of which are expressly incorporated herein by reference.

The present invention relates to a magnetic field sensor on an integrated circuit For high accuracy magnetic field sensors, signal conditioning electronics are required to compensate for imperfections (offset, temperature dependence) of the raw field sensor and these signal conditioning circuits are usually realized in a CMOS integrated circuit (IC). Magnetic sensors may be incorporated in CMOS, however their sensitivity is very low, which is a disadvantage. Hall cells with high sensitivity can be realized with materials exhibiting high electron mobility, as exemplified by certain compound semiconductors like GaAs, InSb, InAs, or heterostructures of such compound semiconductors arranged to obtain deep quantum wells in which high mobility 2D "electron gas" can be created. These materials are more costly per surface area compared to silicon, and the design options for precision electronic circuitry are very limited compared to what is available in CMOS on silicon processes.

Other magnetic field sensors include magnetoresistive field sensors (AMR, GMR, TMR, CMR, EMR, etc. . . . ). These sensors require different process steps from CMOS electronics. They do not depend on a specific substrate material and can be deposited on top of several substrates, including on specifically prepared CMOS substrates in a monolithic integration step, but process and yield considerations (related to the relative surfaces of the field sensor die and the signal conditioning IC) often make it advantageous to fabricate these sensors on separate dies.

The levels of output signal produced by the magnetic field sensors mentioned above, while higher than what silicon hall cells would produce, are still very low, in the mV range, and therefore susceptible to perturbation from the surrounding system through capacitive coupling to the surface of their interconnects to the signal conditioning IC, or from induced voltage produced by time varying external magnetic fields over the loop area of these interconnects.

There is therefore an advantage in providing a magnetic field sensor made of two separate semiconductor components, namely a magnetic field sensor semiconductor die connected to a signal conditioning semiconductor die, such as a CMOS IC.

Known chip to chip assembly methods include:
Wire bonding, as illustrated in FIG. 4a, in which a bond wire 8a interconnects a signal conditioning IC 4 to a magnetic field sensor IC 6' provided with a metallized connection track 7 connected to a sensor active layer 5 (such as a Hall effect layer), the magnetic field sensor IC 6' being bonded on the signal conditioning IC 4.
Deposition of conductive layer, as illustrated in FIG. 4b, there are methods to realize very thin (a few μm) and small (<100 μm side length) active semiconductor components, called chiplets, that can be transferred by a stamp printing process from their source substrate to a target substrate. Because of their small height it is possible to deposit the electrical interconnects with a photolithographic process, by patterning a thin conductive layer.
Flip-chip on chip, as illustrated in FIG. 4c in which a conductive bead 8c is soldered to a connection pad 3 of the signal conditioning IC 4 to a metallized connection track 7 of the magnetic field sensor IC 6' which is flipped upside down such that the sensor active layer 5 faces the signal conditioning IC 4.

One of the drawbacks of the wire bonding technique is the need for a relatively thick layer of insulation molded over the sensor chip and wire bonds. The thick insulation layer increases the volume of the component and in particular the thickness of the packaged sensor.

It is generally advantageous to have thinner magnetic field sensors in order to reduce the airgap of a magnetic core in which the sensor is inserted, or to allow the sensor to be positioned closer to an optimal point of measurement of a magnetic field. For instance, for magnetic field sensors that are used in current sensing applications, it is advantageous to have a magnetic circuit gap in a magnetic core that is as thin as possible to reduce the amount of magnetic flux that is unused. This allows to use smaller magnetic cores and increase the sensitivity of the transducer.

These drawbacks may be overcome by the prior art solutions illustrated in FIGS. 4b and 4c, in particular the flip chip arrangement illustrated in FIG. 4c whereby a thinner packaging layer may be provided in view of the absence of the wire bonds. Such magnetic field sensors can be advantageous for insertion in an airgap of a magnetic core. A drawback of the configuration of FIG. 4b is the cost of manufacture of the semi-conductor component in comparison to the flip chip solution. All conventional solutions however are not well adapted for connecting a plurality of magnetic field sensors in a dense arrangement.

In certain applications there is an advantage of having magnetic active sensing layer as close as possible to a magnetic field source to be measured. For instance, in current sensing applications on a circuit board or leadframe, positioning the sensing layer as close as possible to the conductor in which the current to be measured flows, allows greater sensitivity in the measurement as well as lower sensitivity to external noise in view of the higher signal to noise ratio.

In view of the foregoing, an object of the invention is to provide a magnetic field sensor that overcomes the aforementioned drawbacks and allows to provide a magnetic field sensor that can be positioned very close to a magnetic field to be measured yet have optimal magnetic field sensing properties and signal conditioning properties.

Objects of the invention have been achieved by providing a magnetic field sensor according to claim 1.

Disclosed herein is a magnetic field sensor comprising a signal conditioning IC and a magnetic field sensor IC, the magnetic field sensor IC being mounted on and connected to the signal conditioning IC. The magnetic field sensor IC comprises a semi-conductor substrate with a sensor active layer disposed an outer facing side of the magnetic field sensor opposite the signal conditioning IC. The sensor active layer is connected to conductive vias that extend through the semi-conductor substrate from said outer facing side to an underside facing the signal conditioning IC, an underside of the conductive via being electrically interconnected to a connection pad on the signal conditioning IC via a chip-on-chip interconnection.

The chip-on-chip interconnection may have various configurations, per se known in the art of conductive interconnections, including a conductive connection bead in the form of a bump, stud, stud-bump, copper pillar and the like. The conductive bead may be connected to the underlying chip using various methods, including soldering, compression bonding (a form of welding), thermocompression, and conductive adhesives. In an advantageous embodiment, the conductive connection comprises a bead connection and a solder connection.

In an advantageous embodiment, the sensor active layer comprises or is constituted by a sensor element in the form of a Hall effect sensor element or other form of magneto-resistive sensor element sensitive to a magnetic field.

In an advantageous embodiment, the sensor active layer is connected at a plurality of edge positions to corresponding conductive vias with a connection track on or in the outer facing side bridging between the sensor active layer and corresponding conductive via.

In an advantageous embodiment, the underside of the semi-conductor substrate of the magnetic field sensor IC comprises connection pads covering the conductive via for connection to the bead connection via welding, soldering or integral formation therewith.

In an embodiment, the bead connection is mounted directly on the signal conditioning IC and connected via said solder connection to the conductive via directly or through a connection pad formed on the magnetic field sensing integrated circuit.

In an embodiment, the bead connection is mounted directly on the magnetic field sensor IC to the conductive via or a connection pad mounted over the conductive via, and connected to the connection pad on the signal conditioning IC via said solder connection.

In an advantageous embodiment, the magnetic field sensor IC comprises a plurality of said sensor active layers and corresponding conductive vias and chip-on-chip interconnections.

In an advantageous embodiment, the magnetic field sensor IC comprises an array of at least 2×2 sensor elements.

In an advantageous embodiment, the magnetic field sensor IC comprises an array of at least 2×4 active sensor elements.

In an advantageous embodiment, the magnetic field sensor IC comprises an array of at least 4×4 sensor elements and corresponding conductive vias.

In an advantageous embodiment, said sensor element is connected at four corner positions to corresponding four conducting vias Further objects and advantageous features of the invention will be apparent from the claims, from the detailed description, and annexed drawings, in which:

FIG. 1 is a schematic cross-sectional view of a magnetic field sensor according to an embodiment of the invention;

FIG. 2 is a view similar to FIG. 1, of a variant of the invention;

FIG. 3a is a perspective view of a magnetic field sensor integrated circuit of a magnetic field sensor according to an embodiment of the invention, showing the sensor active layer;

FIG. 3b is a perspective view of an opposite side of the magnetic field sensor integrated circuit of FIG. 3a;

FIG. 3c is a view similar to FIG. 3a showing, in partial transparency, conductive vias within the semi-conductor substrate;

FIGS. 4a to 4c are schematic cross-sectional views of prior art magnetic field sensors.

Referring to FIGS. 1 to 3c, a magnetic field sensor 2 according to embodiments of the invention comprises a signal conditioning integrated circuit 4 and a magnetic field sensor integrated circuit 6 mounted thereon with a chip on chip interconnection 8.

The signal conditioning IC 4 is in a preferred embodiment a CMOS integrated circuit comprising circuitry for processing of the signals from the magnetic field sensor IC 6. The signal conditioning IC comprises connection pads 3, in particular in the form of metallized layers for electrical connection to the magnetic field sensor IC 6.

The magnetic field sensor IC 6 comprises a semi-conductor substrate 13 in which is embedded a sensor active layer 5 that senses a magnetic field and generates a signal proportional to the amplitude of the magnetic field passing through the active layer 5. The sensor active layer 5 may in particular comprise a Hall effect sensing cell (also named herein a sensor element), although within the scope of the invention other magneto-resistive sensing element in the sensing active layers may be used as is per se well known in the art of magnetic field sensors.

The magnetic field sensor IC further comprises conductive vias 9 that extend through the semi-conductor substrate from a sensing side 13a to an opposite underside 13b distal from the sensor active layer 5. Each conductive via 9 may be in the form of metallized columns or posts formed through the semi-conductor substrate 13. A connection track 7 electrically interconnects a portion, in particular an edge of the sensor active layer 5, to an end of the conductive via 9 at the sensing side 13a.

The magnetic field sensor IC 6 is in a preferred embodiment a compound semiconductor, e.g. GaAs, or compound semiconductor heterostructures producing a 2D electron gas with a high electron mobility] integrated circuit, the conductive vias formed by gold or copper.

As best seen in FIG. 3a, which illustrates sensor active layers 5 comprising or constituting Hall effect sensor elements, there are four connection tracks 7 connected to respective four corner positions of the sensor active layer 5, configured to be connected as per se well known in the art.

The conductive via 9 is electrically connected at the underside 13b of the semi-conductor substrate 13 to the chip on chip interconnection 8. A connection pad 11, for instance in the form of a metallized layer, may be formed on the underside 13b covering the conductive via 9 and optionally extending beyond the diameter of the conductor via 9 as illustrated in FIGS. 1 and 2. The chip on chip interconnection 8 comprises a conductive bead connection 10, in particular in the form of a metallic bump integrally formed with the conductor via 9, or welded or soldered thereto. The bead connection 10 is configured for soldering via a solder connection 12 to the connection pad 3 on the signal conditioning IC 4. In the variant illustrated in FIG. 2, as opposed to FIG. 1, the bead connection 10, in the form of a metallic bump of material, is welded, soldered or directly formed with the connection pad 3 on the signal conditioning IC 4.

Advantageously, the embodiments according to the invention provide a sensor active layer 5 that is on an outer facing side of the magnetic field sensor 2, thus allowing the sensor active layer to be positioned very close to a point where a magnetic field is to be measured. Moreover, the absence of bond wires allows the overall thickness of the magnetic field sensor, including any insulating layers packaged or surrounding the ICs 4, 6 to be very thin.

The connection of the magnetic field sensor IC 6 on the signal conditioning IC 4 according to embodiments of the invention using the conductive vias 9 also very advantageously allows to provide a configuration with a high connection density compared to configurations of the prior art such as shown in FIG. 4c in which the sensor active layer is facing the outer side of the magnetic field sensor. As can be easily appreciated from the embodiment illustrated in FIGS. 3a to 3c, sensor active layers 5 may be positioned on the semi-conductor substrate 13 in a closely packed arrangement since the bead connections 10 are provided on the underside 13b that is free of the sensor active layers 5 and can thus be easily and directly connected to corresponding connection pads on the signal conditioning IC. The separation of the connection points on the underside of the semi-conductor substrate with respect to the sensing layers is thus particularly advantageous even with respect to conventional flip chip arrangements since the absence of the sensor active layers provides more surface area for the solder connections with the connection beads. The dense arrangement also means that a large plurality of sensor active layers 5 may be provided on the semi-conductor substrate 13.

LIST OF REFERENCES USED electric current transducer 1
  magnetic field sensor 2
    signal conditioning integrated circuit 4 (signal conditioning IC) connection pad 3
    magnetic field sensor integrated circuit 6 (magnetic field sensor IC)
      semiconductor substrate 13
        outer side (upper side) 13a
        underside 13b
      sensor active layer 5
      connection track 7
      conductive via 9
      connection pad 11
    chip-on-chip interconnection 8
      bead connection 10
      solder 12
    Bond wire 8'

The invention claimed is:

1. A magnetic field sensor comprising a signal conditioning IC and a magnetic field sensor IC, the magnetic field sensor IC mounted on and connected to the signal conditioning IC, the magnetic field sensor IC comprising a semi-conductor substrate with a sensor active layer disposed an outer facing side of the magnetic field sensor opposite the signal conditioning IC, the sensor active layer connected to conductive vias that extend through the semi-conductor substrate from said outer facing side to an underside facing the signal conditioning IC, an underside of the conductive via being electrically interconnected to a connection pad on the signal conditioning IC via a chip-on-chip interconnection.

2. Magnetic field sensor according to claim 1, wherein the chip-on-chip interconnection comprises a bead connection.

3. Magnetic field sensor according to claim 1, wherein the chip-on-chip interconnection comprises a solder connection.

4. Magnetic field sensor according to claim 1, wherein the sensor active layer comprises a Hall effect sensor element or other form of magneto-resistive sensor element sensitive to a magnetic field.

5. Magnetic field sensor according to claim 1, wherein the sensor active layer is connected at a plurality of corner positions to corresponding conductive vias with a connection track on or in the outer facing side bridging between the sensor active layer and corresponding conductive via.

6. Magnetic field sensor according to claim 1, wherein on the underside of the semi-conductor substrate of the magnetic field sensor IC, connection pads covering the conductive via are provided for connection to the bead connection via welding, soldering or integral formation therewith.

7. Magnetic field sensor according to claim 1, wherein the bead connection is mounted directly on the signal conditioning IC and connected via said solder connection to the conductive via directly or through a connection pad formed on the magnetic field sensing integrated circuit.

8. Magnetic field sensor according to claim 1, wherein the bead connection is mounted directly on the magnetic field sensor IC to the conductive via or a connection pad mounted over the conductive via, and connected to the connection pad on the signal conditioning IC via said solder connection.

9. Magnetic field sensor according to claim 1, wherein the magnetic field sensor IC comprises a plurality of said sensor active layers and corresponding conductive vias and chip-on-chip interconnections.

10. Magnetic field sensor according to claim 1, wherein the magnetic field sensor IC comprises an array of at least 2×2 sensor elements.

11. Magnetic field sensor according to claim 1, wherein the magnetic field sensor IC comprises an array of at least 2×4 sensor elements.

12. Magnetic field sensor according to claim 11, wherein the magnetic field sensor IC comprises an array of at least 4×4 sensor elements and corresponding conductive vias.

13. Magnetic field sensor according to claim 1, wherein each said sensor active layer is connected at four positions to corresponding four conducting vias.

\* \* \* \* \*